AMPLIFIER WITH POSITIVE AND NEGATIVE FEEDBACK
Filed Jan. 13, 1949
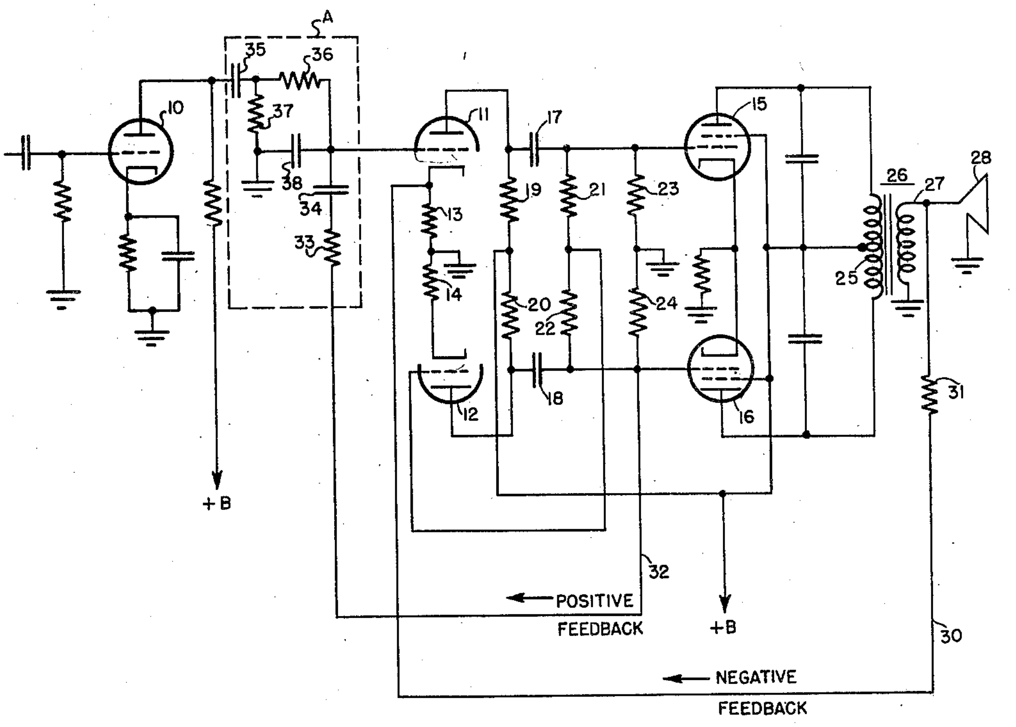
Inventor
JOHN M. MILLER, JR.
By Killman and Kerst
Attorneys Patented Sept. 15, 1953 2,652,458

UNITED STATES PATENT OFFICE 2,652,458

AMPLIFIER WITH POSITIVE AND NEGATIVE FEEDBACK

John Milton Miller, Jr., Baltimore, Md., assignor to Bendix Aviation Corporation, Towson, Md., a corporation of Delaware Application January 13, 1949, Serial No. 70,746

4 Claims. (Cl. 179—171)

This invention relates to amplifiers employing positive and negative feedback for economically securing improved performance over a wide frequency range. The invention is particularly applicable to transformer coupled audio power amplifiers suitable for use in mass produced broadcast receivers and amplifier systems, although it may be used beneficially in expensive amplifiers.

It has previously been customary to use pentode or beam pentode output tubes in economical transformer coupled power amplifiers because of their high efficiency and the economy with which they can be driven. The chief disadvantages of pentodes in such an application are the high harmonic distortion encountered, which is made still further objectionable by the considerable percentage of higher order harmonics present, and the high output impedance that results, which gives poor damping of a load such as a loudspeaker.

The above disadvantages have been overcome to some extent by the use of negative feedback. However, it has never been possible in an economical amplifier to employ sufficient feedback to obtain negligible harmonic distortion and a negligibly small output impedance because of the great loss in gain resulting, and because of oscillations that are encountered due to the inevitable phase shift that takes place in the amplifier (and in the transformer, if transformer coupled) as well as in the negative feedback system, at very low and very high frequencies. In order to obtain very large amounts of negative feedback, it has been necessary to use very costly output transformers, and in addition, phase shift correcting networks in the amplifier stages, to avoid oscillation. In general, the worst phase shifts are due to the output transformer. However, the phase shift is made still worse by the fact that it is usually necessary to apply the negative feedback over a number of stages to obtain the desired reduction in distortion and output impedance.

In amplifiers where no output transformer is used, some improvement has been obtained by the use of a combination of overall negative potential feedback and internal positive potential feedback in an early stage of the amplifier. In this manner, an improvement in gain is obtained while most of the advantages of negative feedback are retained. However, it has not been possible to obtain negligibly low output impedance and non-linearity with this system in an economical audio power amplifier where an output transformer is used, because of the phase shift in the output transformer at very low and very high frequencies, which will cause oscillation. Again, some improvement can be made by the use of a very costly output transformer and phase correcting networks in the amplifier stages.

Another expedient which has been resorted to is the use of a separate winding on the output transformer from which the negative feedback is obtained, in an effort to reduce the phase shift in the negative feedback voltage caused by the output transformer.

It is an object of this invention to provide an amplifier in which distortion and oscillation are economically eliminated over a wide range of frequencies.

It is a further object of this invention to provide an amplifier in which the elimination of distortion and oscillation over a wide frequency range may be realized together with a low output impedance which may be of zero or negative value.

It is another object of this invention to provide an amplifier having positive and negative voltage feedback in which the effects of phase shift in the negative feedback loop at very high and very low frequencies are economically overcome.

It is another object of the invention to provide an economical transformer coupled amplifier capable of serving as an audio power amplifier without substantial distortion or oscillation over a wide frequency range.

These and other objects and advantages of the invention are realized by an amplifier incorporating both positive and negative voltage feedback loops in which an impedance network is provided operative upon the positive feedback loop, at frequencies at which the phase of the energy fed back by the negative feedback loop is shifted toward a positive sense, to shift the phase of the energy fed back by the positive feedback loop toward a negative sense, by an amount sufficient to restrain said amplifier from oscillation.

Such an embodiment of the invention is described in the following specification and illustrated in the accompanying drawing, the single figure of which is a schematic diagram of an audio power amplifier circuit utilizing the invention.

In the illustrated circuit a conventional amplifier stage comprising the triode 10 has its output applied by way of an RC network A shown enclosed in a dashed block, to the control grid of one of two triodes 11 and 12 which act as a phase inverter. The phase inverter is of the self balancing type. The cathodes of tubes 11 and 12 are connected through a pair of resistors 13 and 14 having their junction point grounded. The anodes are connected respectively to the control grids of a pair of tetrodes 15 and 16 by way of condensers 17 and 18. The anodes of tubes 11 and 12 are also joined by a three-branch parallel network of resistors, each branch consisting of two serially connected resistors 19 and 20, 21 and 22, and 23 and 24 respectively. The junction point of resistors 21 and 22 is connected to the control grid of tube 12. The tubes 15 and 16 are connected to form a conventional push-pull output stage feeding the primary 25 of output transformer 26. The secondary 27 of this transformer feeds a loud speaker 28.

Negative voltage feedback is obtained from the secondary of transformer 26 by way of conductor 30 through resistor 31 to the cathode of tube 11. Positive voltage feedback is obtained from the control grid of tube 16 by way of conductor 32. through resistor 33 and condenser 34 forming a part of network A, to the control grid of tube 11. The remainder of network A comprises a condenser 35 in the output lead of tube 10 in series with a two-branched parallel circuit having a resistor 36 in one branch and a resistor 37 and a condenser 38 serially connected in the other branch. The junction point of resistor 37 and condenser 38 is grounded.

By the arrangement just described sufficient positive feedback is secured at the intermediate frequency range of the amplifier to create a condition of critical regeneration in the circuit of tubes 11 and 12 so that these tubes are on the verge of oscillation with the negative feedback disconnected. The presence of the negative feedback loop controls the tendency toward oscillation and renders the amplifier very stable.

It is desirable to maintain approximately this condition of critical regeneration over the entire range of useful frequencies since it provides the equivalent of a very high gain amplifier without incurring the penalty of the large phase shifts at boundary frequencies which would be found in an amplifier of many stages. In addition to the economy in amplifier material, the low phase shift permits the use of an economical negative feedback loop, particularly including an economical output transformer. The overall gain is then primarily an inverse function of the feedback factor of the negative feedback loop and is only slightly influenced by variation of tube characteristics. By appropriate choice of the equivalent amplifier gain and of the negative feedback factor, the effective output impedance may be reduced substantially to zero, or may even be made sufficiently negative that most of the resistance of a dynamic load (such as a loudspeaker) will be cancelled to provide excellent damping. Conventional feedback theory shows that with zero or slightly negative output impedance, harmonic distortion and intermodulation will be negligible at any signal level up to that at which some element is so badly overloaded that one of the feedback loops is disabled during some portion of the signal excursion.

Through the efforts of many workers, the virtues inherent in the use of combined feedback have gradually become known, but they have not been economically realized in practice in cascade amplifiers and particularly in transformer coupled amplifiers. While the desirable results can be obtained over a wide frequency range, the phase shifts in the amplifiers and transformers embraced by the negative feedback loop occurring outside this range will disable the amplifier by making the feedback positive and causing oscillation unless suitable precautions are taken. In the past, two methods have been employed to prevent oscillation, either alone or in combination. According to one method which has been thoroughly investigated, the various coupling elements which contribute to phase shift and coincidental signal attenuation are designed so that the frequency response curve of all elements embraced in the negative feedback loop will exhibit a slope no greater than 10 db per octave at any frequency for which the overall loop transmission is above unit. Practice of this method generally involves such rigorous control of components, especially transformers, over such a wide range of frequencies, as to make it economically unfeasible. The other method applies compensatory phase shifts in the negative feedback loop and is likewise prohibitively costly.

According to the present invention, coincidental phase shift and attenuation is introduced in the positive feedback loop at the boundaries of the useful frequency range, so as to rapidly reduce the equivalent amplifier gain embraced by the negative feedback loop without introducing into the latter the large phase shifts which would accompany the use of passive filter networks. By appropriate choice of the coupling components of the positive feedback loop and of the portion of the amplifier it embraces, the sense of this feedback may be caused to reverse at frequencies only moderately removed beyond the boundaries of the useful range, resulting in a very low value of equivalent amplifier gain in the regions of these frequencies. By use of the most economical coupling elements in the remaining portion of the amplifier, a rapid cutoff may be obtained in these regions with complete indifference to the rapid phase changes occurring in the elements embraced by the nominally negative feedback loop, because the amplifier gain has become too small to permit oscillatory conditions to be established through this loop. At frequencies still more remote from the useful range there may be regions where the sense of both feedback loops will be positive, but if all coupling elements have been chosen with an eye to economy, the effective loop gains will be too small to permit oscillation. An exception might be made in the case of an amplifier involving a considerable number of stages, but this condition is not contemplated because it is more economical to provide an adjustable element fixing the amount of positive feedback than to increase the number of stages.

In the figure, the network A accomplishes the desired control of the internal feedback loop so that it provides positive feedback in the useful signal range and negative feedback at frequencies sufficiently removed from this range. At audio frequencies where condensers 34 and 35 have a very low reactance the amount of positive feedback is determined primarily by the ratio of the resistance of resistor 36 to the resistance of the resistor 33. The input resistance of tube 11 and the plate resistance of tube 10, however, have some influence. At lower audio frequencies, the positive feedback is controlled by the ratio of the capacity of condenser 34 to that of condenser 35. The ratio of these capacities should be approximately equal to the ratio of the resistance of resistor 36 to the resistance of resistor 33 in order to obtain approximately uniform phase and voltage conditions in the positive feedback loop through the useful range of audio frequencies. Resistor 37 reduces the amplitude and shifts the phase of the positive feedback energy at very low frequencies, thus eliminating at these frequencies the danger of oscillation that would exist due to phase shift and reduction of amplitude of the negative feedback energy. Condenser 38 reduces the amplitude and shifts the phase of positive feedback energy at very high audio frequencies thus performing the same functions of compensating for deficiencies of the negative feedback loop at these frequencies. The dynamic input capacity of tube 11 constitutes effectively a part of the capacity of condenser 38, so that this condenser may be omitted when the input capacity of the tube is of itself sufficient for this purpose.

There are listed below the values that were used in a successful circuit embodying the invention. These are to be taken as purely illustrative and not in any sense as limiting or defining the scope of the invention.

| | |
|---|---|
| Tube 10 | 6J5 |
| Tubes 11, 12 | 6SN7 |
| Tubes 15, 16 | 6V6 |
| Transformer 26: | |
| Primary | 8000 ω |
| Secondary | 3.2 ω |
| Loudspeaker | 3.2 ω |
| Condensers: | |
| 34 | .006 mfd. |
| 35 | .05 mfd. |
| 38 | 68 mmfd. |
| 17, 18 | 0.3 mfd. |
| Resistors: | |
| 33 | .91 meg. |
| 36 | .1 meg. |
| 37 | .33 meg. |
| 13 | 4.7 K. |
| 14 | 1.5 K. |
| 19, 20 | 47 K. |
| 21 | .39 meg. |
| 22, 23, 24 | .47 meg. |
| 31 | 2.2 K. |

What is claimed is:

1. In an amplifier comprising a number of cascaded stages, a first feedback loop embracing a plurality of said stages, said first feedback loop having a loop gain numerically substantially greater than unity and negative in sense in the desired range of operation of said amplifier and being subject to phase shifts which render it positive in sense at frequencies outside said desired range of operation, a second feedback loop embracing at least one less of said stages embraced by said first feedback loop, said second feedback loop having a loop gain of approximately unity and positive in sense in said desired range of operation, the improvement comprising a phase shifting network in said second feedback loop consisting of a plurality of impedance means of such nature, magnitude and interconnections as to present to said second feedback loop a minimum of impedance within said desired range of operation and to present to said second feedback loop, at frequencies above and below said range an impedance of such character and value as to reduce the amplitude and shift the phase of the energy fed back thereby, the said phase shift being sufficient to reverse the sense of the feedback of said second feedback loop to the negative at all frequencies outside said desired range where the sense of the feedback through said first feedback loop is positive and the loop gain thereof would otherwise be greater than unity.

2. In an amplifier comprising a number of cascaded stages, a first feedback loop embracing a plurality of said stages, said first feedback loop having a loop gain numerically substantially greater than unity and negative in sense in the desired range of operation of said amplifier and being subject to phase shifts which render it positive in sense at frequencies outside said desired range of operation, a second feedback loop embracing at least one less of said stages embraced by said first feedback loop, said second feedback loop having a loop gain of approximately unity and positive in sense in said desired range of operation, the improvement comprising a phase shifting network in said second feedback loop consisting of a plurality of impedance means of such nature, magnitude and interconnections as to present to said second feedback loop within said desired range of operation an impedance substantially constant in character and magnitude, to present to said second feedback loop at frequencies below said range a shunting impedance predominantly resistive and of such value as to reduce the amplitude and shift the phase of the energy fed back thereby and to present to said second feedback loop at frequencies above said range a shunting impedance predominantly capacitive and of such value as to reduce the amplitude and shift the phase of the energy fed back thereby, the said phase shifts being sufficient to reverse the sense of the feedback of said second feedback loop to the negative at all frequencies outside said desired range where the sense of the feedback through said first feedback loop is positive and the loop gain thereof would otherwise be greater than unity.

3. In an amplifier comprising a number of cascaded stages, a first feedback loop embracing a plurality of said stages, said first feedback loop having a loop gain numerically substantially greater than unity and negative in sense in the desired range of operation of said amplifier and being subject to phase shifts which render it positive in sense at frequencies outside said desired range of operation, a second feedback loop embracing at least one less of said stages embraced by said first feedback loop, said second feedback loop having a loop gain of approximately unity and positive in sense in said desired range of operation, the improvement comprising a phase shifting network in said second feedback loop consisting of a plurality of impedance means of such nature, magnitude and interconnections as to present to said second feedback loop in the upper portion of said desired range of operation an impedance predominantly resistive in character and in the lower portion of said desired range of operation an impedance predominantly capacitive in character, the impedance presented by said network throughout said range of operation being substantially constant, said network presenting to said second feedback loop at frequencies below said range a shunting impedance predominantly resistive and of such value as to reduce the amplitude and shift the phase of the energy fed back thereby and presenting to said second feedback loop at frequencies above said range a shunting impedance predominantly capacitive and of such value as to reduce the amplitude and shift the phase of the energy fed back thereby, the said phase shifts sufficient to reverse the sense of the feedback of said second feedback loop to the negative all frequencies outside said desired range where the sense of the feedback through said first feedback loop is positive and the loop gain thereof would otherwise be greater than unity.

4. In an amplifier comprising a number of cascaded stages, a first feedback loop embracing a plurality of said stages, said first feedback loop having a loop gain numerically substantially greater than unity and negative in sense in the desired range of operation of said amplifier and being subject to phase shifts which render it positive in sense at frequencies outside said desired range of operation, a second feedback loop embracing at least one less of said stages embraced by said first feedback loop, said second feedback loop having a loop gain of approximately unity and positive in sense in said desired range of operation, the improvement comprising a phase shifting network in said second feedback loop consisting of a plurality of impedance means of such nature, magnitude and interconnection as to constitute with respect to said second feedback loop in the upper portion of said range of operation a predominantly resisitive voltage divider and to constitute in the lower portion of said range of operation a predominantly capacitive voltage divider, the impedance presented by said network being substantially constant throughout said range, said network presenting to said second feedback loop at frequencies below said range a shunting impedance predominantly resistive and of such value as to reduce the amplitude and shift the phase of the energy fed back thereby and presenting to said second feedback loop at frequencies above said range a shunting impedance predominantly capacitive in character and of such value as to reduce the amplitude and shift the phase of the energy fed back thereby, the said phase shifts being sufficient to reverse the sense of the feedback of said second feedback loop to the negative at all frequencies outside said desired range where the sense of the feedback through said first feedback loop is positive and the loop gain thereof would otherwise be greater than unity.

JOHN MILTON MILLER, Jr.

References Cited in the file of this patent

UNITED STATES PATENTS

| Number | Name | Date |
|---|---|---|
| 1,654,075 | Gorton | Dec. 27, 1927 |
| 2,245,598 | Llewellyn | June 17, 1941 |
| 2,246,158 | Worcester, Jr. | June 17, 1941 |
| 2,266,168 | Crabtree | Dec. 16, 1941 |
| 2,272,235 | Boucke | Feb. 10, 1942 |
| 2,282,381 | Root | May 12, 1942 |
| 2,282,383 | Root | May 12, 1942 |
| 2,386,892 | Hadfield | Oct. 16, 1945 |
| 2,439,245 | Dunn | Apr. 6, 1948 |

OTHER REFERENCES

Ginzon, "Balanced Feedback Amplifiers," pp. 1367–1379, vol. 26, No. 11, November 1938, Proceedings of The Institute of Radio Engineers.